US009819353B2

United States Patent
Vagni et al.

(10) Patent No.: US 9,819,353 B2
(45) Date of Patent: Nov. 14, 2017

(54) APPARATUS AND METHOD FOR TESTING AN ANALOG-TO-DIGITAL CONVERTER

(71) Applicant: Infineon Technologies AG, Neubiberg (DE)

(72) Inventors: Dario Vagni, Villach (AT); Peter Bogner, Wernberg (AT); Jaafar Mejri, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/282,677

(22) Filed: Sep. 30, 2016

(65) Prior Publication Data

US 2017/0099062 A1   Apr. 6, 2017

(30) Foreign Application Priority Data

Oct. 2, 2015 (DE) .................. 10 2015 116 786

(51) Int. Cl.
*H03M 1/10* (2006.01)
*H03M 1/12* (2006.01)

(52) U.S. Cl.
CPC ....... H03M 1/1071 (2013.01); H03M 1/1245 (2013.01)

(58) Field of Classification Search
CPC .............. H03M 1/1071; H03M 1/1245; G01R 31/31924; G01R 19/257; G01R 29/0276
USPC .................................................. 341/120, 155
See application file for complete search history.

(56) References Cited

U.S. PATENT DOCUMENTS

| 7,079,060 B2 * | 7/2006 | Tarui ................... G01R 19/257 341/120 |
| 7,936,293 B2 | 5/2011 | Hamashita |
| 8,970,408 B2 * | 3/2015 | Bogner ............. G01R 31/2884 341/118 |

(Continued)

FOREIGN PATENT DOCUMENTS

| JP | 2005-227057 | 8/2005 |
| JP | 2009-303157 | 12/2009 |
| JP | 2015-015709 | 1/2015 |

(Continued)

OTHER PUBLICATIONS

Notice of Reasons for Rejection in parallel Japanese Patent Application No. 2016-194478, dated Aug. 29, 2017.

*Primary Examiner* — Khai M Nguyen
(74) *Attorney, Agent, or Firm* — Dicke, Billig & Czaja, PLLC

(57) ABSTRACT

A method for use in testing an analog-to-digital converter. The method includes providing a set of bins, varying a voltage, taking samples of the voltage, providing a selection flag, associating each sample with one bin of the set of bins, and observing a number of samples associated with the bins. An apparatus includes an analog-to-digital converter configured to convert a voltage at an input node to a digital representation provided at an output node. The input node is configured to be coupled to a voltage generator. A sample select unit is configured to determine if a voltage at the input node at least equals a first threshold level and does not exceed a second threshold level. The apparatus is configured, based on the determining, to selectively associate the digital representation with a bin of a set of bins.

20 Claims, 6 Drawing Sheets

(56) References Cited

U.S. PATENT DOCUMENTS 9,240,798 B2 * 1/2016 Harrington ............ H03M 1/109
2015/0249458 A1 9/2015 Harrington et al.

FOREIGN PATENT DOCUMENTS

JP 2017-511052 4/2017
WO 2015/131197 9/2015

* cited by examiner

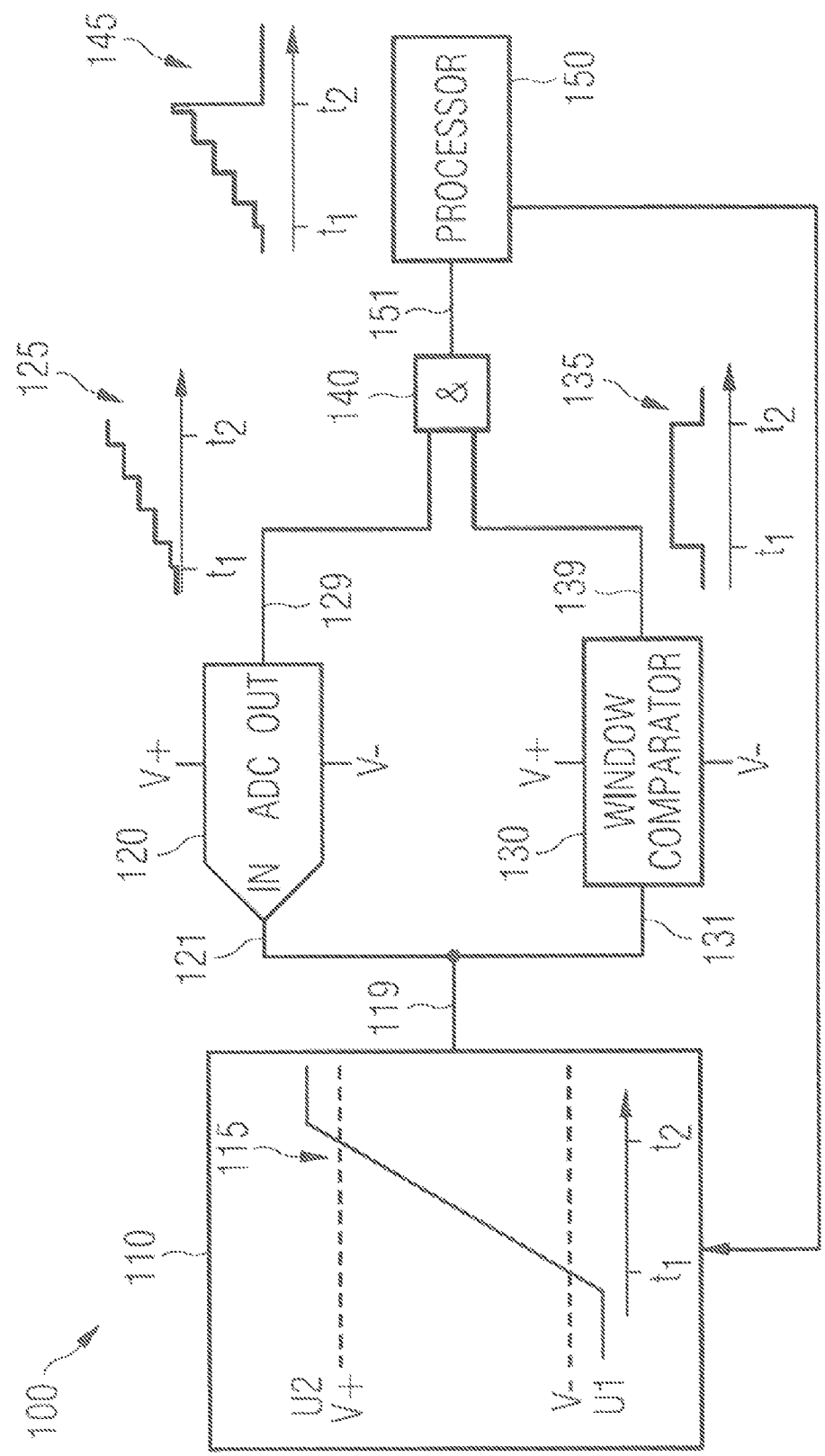

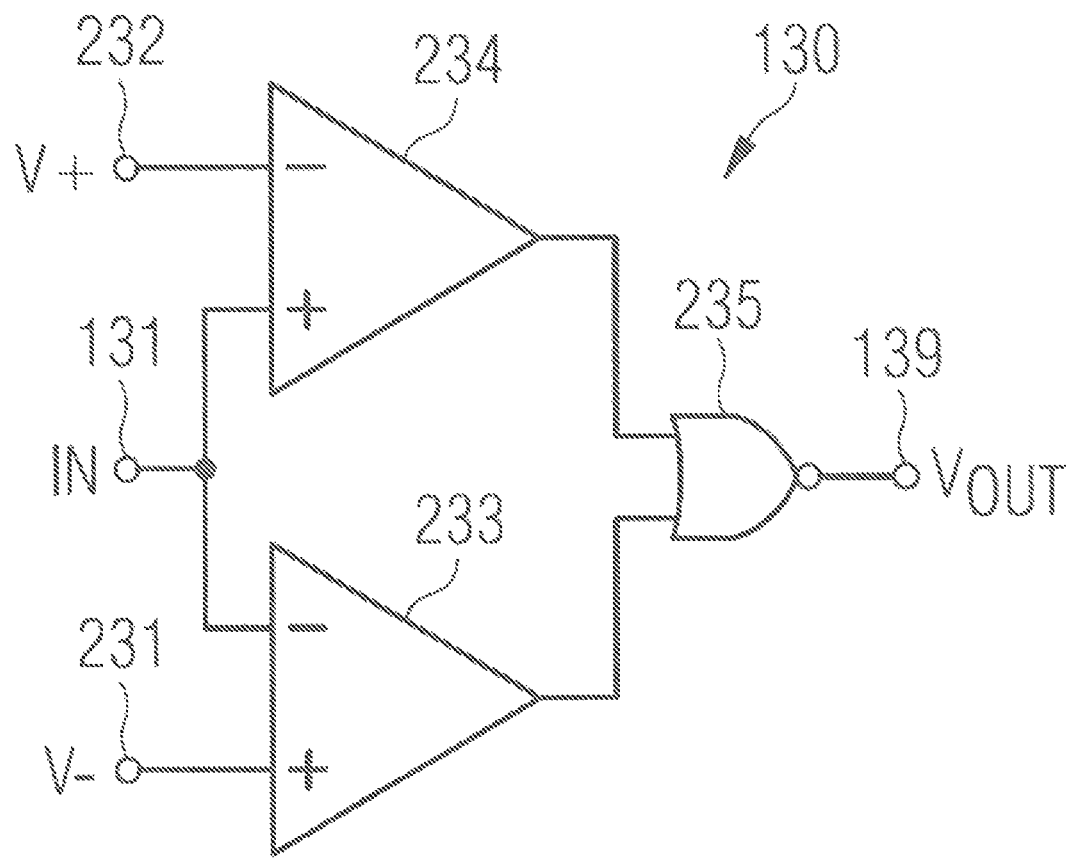

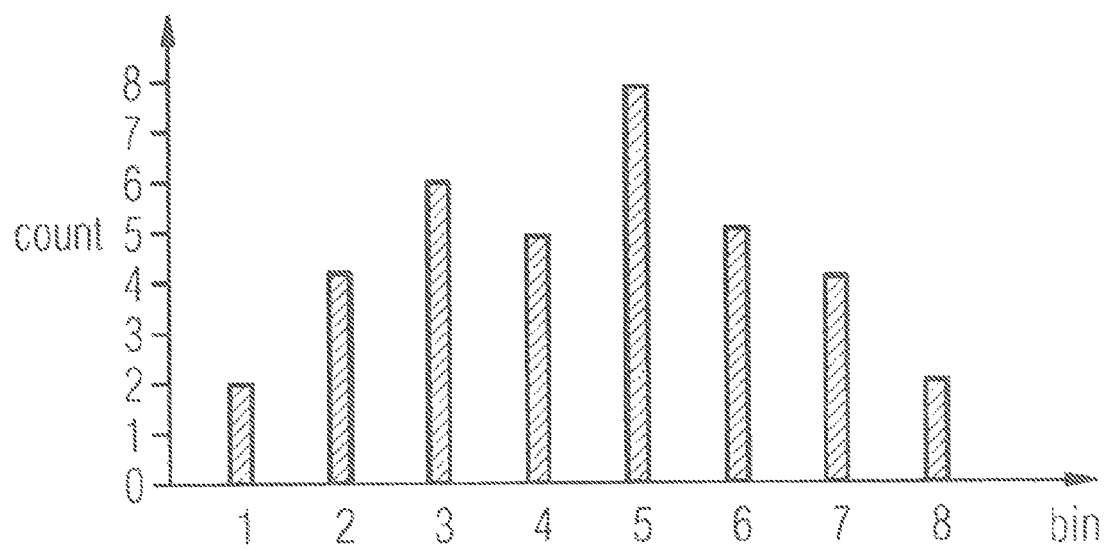

APPARATUS AND METHOD FOR TESTING AN ANALOG-TO-DIGITAL CONVERTER

CROSS-REFERENCE TO RELATED APPLICATION

This Utility Patent Application claims priority to German Patent Application No. 10 2015 116 786.7, filed Oct. 2, 2015; and which is incorporated herein by reference.

FIELD OF INVENTION

The present disclosure relates to testing an analog-to-digital converter (ADC).

BACKGROUND

As an example of an ADC, a successive approximation ADC converts a continuous analog waveform into a discrete digital representation via a binary search through all possible quantization levels before finally converging upon a digital output for each conversion. With increasing numbers of bits and a capability to operate at lower reference voltages, testing of ADCs is becoming challenging and expensive. For example, a 12 bit-ADC with a 3.3V voltage reference has a least significant bit (LSB) of $$LSB = \frac{3.3 \text{ V}}{2^{12}} = \sim 800 \text{ uV}.$$

Test instruments must have even better direct current (DC) accuracies.

There are numerous approaches for testing ADCs. One approach is to use mixed-signal automatic test equipment that can provide an accuracy of 1-2 mV. One approach is to set test limits beyond an ADC's specification which may mean that the ADC's specification is not fully verified in production testing. Accepting yield loss because of poor tester accuracy is also an option. This approach is disadvantageous because of insufficient test results that do not provide adequate reliability in operation of the ADC.

SUMMARY

The following presents a simplified summary in order to provide a basic understanding of one or more aspects of the invention. This summary is not an extensive overview of the invention and is neither intended to identify key or critical elements of the invention, nor to delineate the scope thereof. Rather, the primary purpose of the summary is to present some concepts of the invention in a simplified form as a prelude to the more detailed description that is presented later.

The present disclosure is directed to an apparatus for use in digitally representing an analog value. The apparatus comprises an ADC configured to convert a voltage at an input node to a digital representation provided at an output node. The apparatus comprises a sample select unit configured to determine if a voltage at the input node at least equals a first threshold level and does not exceed a second threshold level. The apparatus is configured, based on the determining, to selectively associate the digital representation with a bin of a set of bins. Further disclosed herein are embodiments that relate to methods of testing an ADC.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognize additional features and advantages upon reading the following detailed description, and upon viewing the accompanying drawings.

BRIEF DESCRIPTION OF THE DRAWINGS

FIG. 1 is a schematic diagram illustrating an apparatus according to some embodiments.

FIG. 2 is a schematic diagram illustrating a window comparator for use in the apparatus of FIG. 1 according to some embodiments.

FIG. 4 is a diagram illustrating a histogram provided in testing the ADC in the apparatus of FIG. 1 according to some embodiments.

DETAILED DESCRIPTION

Figure 3A:
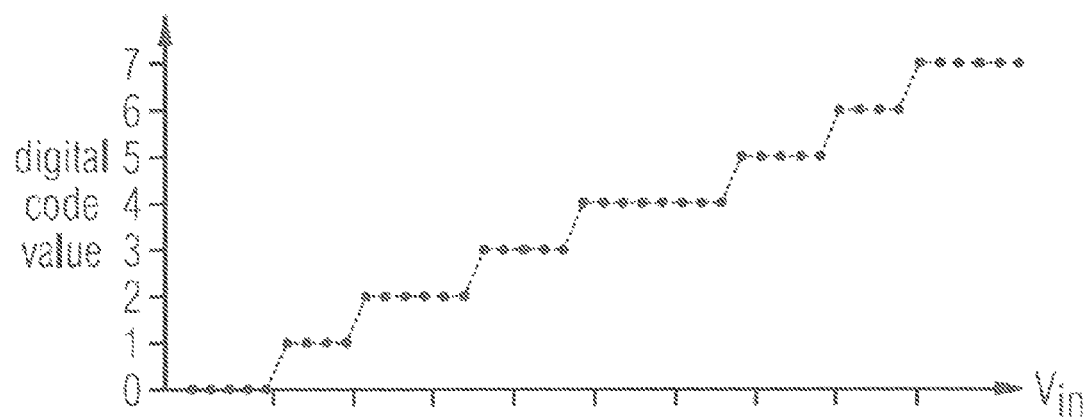
FIG. 3A is a diagram illustrating output from an ADC in the apparatus of FIG. 1 according to some embodiments.

FIG. 1 is a schematic diagram illustrating an apparatus (e.g., a microcontroller) 100 for use in digitally representing an analog value. The apparatus 100 includes a voltage generator 110, an ADC 120, a window comparator 130, a filter operator 140, and a processor 150.

The voltage generator 110 is configured to generate a voltage varying according to a predetermined function of time and to provide the voltage at an output node 119 to the ADC 120 and to the window comparator 130. The predetermined function of time can be a ramp, i.e., monotonically rising with time or, in an alternate implementation, monotonically falling with time. In other words, the ramp can be up or down. For example the predetermined function is a linear ramp in time from a first voltage $U_1$ to a second voltage $U_2$ as schematically illustrated, for example, in a time line diagram 115. Other functions such as a sinusoidal function or any other function of time, in particular if predetermined, can be contemplated as well, if the voltage level at a given time can thus be known.

The ADC 120 is configured to convert a voltage provided at an ADC input node 121 into a digital representation and provide the same at an ADC output node 129. The digital representation can be a digital code of an analog voltage value. The digital code can be expressed as a sequence of LOW and HIGH voltage levels and/or as a transition between LOW and HIGH voltage levels. The ADC input node 121 is coupled to the output node 119 of the voltage generator 110 to receive the voltage from the voltage generator 110. Accordingly, the digital code provided at the ADC output node 129 can represent an analog value of the voltage generated by the voltage generator 110.

The ADC 120 is characterized by a transfer function. The transfer function is a code vs. voltage relationship that defines the ADC output vs. input function. An exemplary digital output corresponding to the analog linear voltage ramp 115 in accordance with a transfer function of the ADC 120 is schematically illustrated in a time line diagram 125. Given the transfer function, an input dynamic range of the ADC 120 states a minimum voltage and a maximum voltage. If the voltage provided at the ADC input node 121 is within the input dynamic range, then ADC 120 produces the digital code that represents the provided voltage. Ideal transition voltages are voltages within the input dynamic range of the ADC 120 at which the ADC output, according to the ideal transfer function, changes from one code to another. In contrast, the ADC 120 does not output any digital representation of a voltage that is outside the ADC's input dynamic range, i.e., below the minimum voltage or above the maximum voltage. Therefore, if the ADC's input node 121 is set to a voltage outside the ADC's input dynamic range, then digital code provided at the ADC's output 129 must not be regarded as representative of the voltage at the ADC input node 121.

There can be a discrepancy between the actual transfer function of the ADC 120 and the ADC's ideal transfer function. For example, an offset error of the ADC 120 is a difference between the ideal first transition voltage and an actual first transition voltage. A gain error is the difference in the slope of the ADC's ideal transfer function and the slope of an actual transfer function of ADC 120. The gain error is measured as the difference in the number of ideal code widths from the first to last conversion between the ideal transfer function and the actual transfer function, wherein an ideal code width is an amount of the dynamic input range (in Volts) that an ideal ADC would convert to each code.

The window comparator 130 is coupled to the output node 119 of the voltage generator 110 and configured to compare a voltage provided at a window comparator input node 131 to a voltage window defined by a first threshold voltage V− and a second threshold voltage V+ which is larger than V−. In some implementations V+ and V− are also applied to the ADC 120. The window comparator 130 is configured to flag, at an output node 139, a result of the comparison. An exemplary output signal of the window comparator 130 to flag, if the input voltage of the analog linear voltage ramp 115 is inside the comparator's voltage window or not, is schematically illustrated in a time line diagram 135.

To give an example, FIG. 2 is a schematic diagram illustrating a window comparator 130 for use in the apparatus of FIG. 1 according to some embodiments. Like references numerals from FIG. 1 correspond to the same elements. The window comparator 130 has a first node 231 to be set to a first threshold voltage V− and a second node 232 to be set to a second threshold voltage V+. Further, the window comparator 130 has the voltage input node 131 configured to receive an input voltage Vin, for example, from the voltage generator 110. The window comparator 130 comprises a first comparator 233 coupled to the first node 231 set to the first threshold voltage and coupled to the input node 131. Further, the window comparator 130 comprises a second comparator 234 coupled to the second node 232 set to the second threshold voltage V+ and coupled to the input node 131. In the example, a NAND gate 235 is coupled to outputs from the comparators 233 and 234 and configured to output a digital signal to an output node 139 of the window comparator 130. If the input voltage at the input node 131 is larger than V− and smaller than V+, then the window comparator 130 sets the window comparator output node 139 to one of two predetermined levels, otherwise to the other level, for example, to a HIGH level if the voltage at the input node 131 is larger than V− and smaller than V+ (hence the word "window" in "window comparator", and otherwise to a LOW level. Thus, the window comparator 130 provides a flag at the output node 139 that is indicative of the input voltage Vin being inside the predetermined voltage window or not. Of course, the definition can also be inverted; that is a matter of design by the skilled person. Further, as a design choice of the skilled person, the window comparator 130 can be configured to provide the HIGH level also if the voltage at the window comparator input node 131 equals V− and/or equals V+. Further, the skilled person can contemplate other arrangements of the described components and voltages to achieve an equivalent operation.

The filter operator 140 is configured to accept output from the ADC 120 and from the window comparator 130 and to provide a combined output signal for further processing. An exemplary signal, based on output as illustrated in the above-described time line diagrams 115, 125, 135 and output from the filter operator 140, is schematically illustrated in a time line diagram 145. In some embodiments, the filter operator 140 is configured to act as a select filter on the input from the ADC 120 such that the filter operator 140 selects the ADC's output for processing if the window comparator's output is HIGH, and otherwise does not select but, instead, suppresses the ADC's output and outputs a LOW. In an alternative embodiment, the ADC 120 and the window comparator 130 can be arranged differently and/or signal levels can be used differently to implement a select filter function. For example, the window comparator can be coupled to the ADC in series to avoid use of a filter operator or the like (not shown in FIG. 1). In some embodiments, the filter operator 140 can be avoided, for example, if the processor 150 is configured to provide, based on the flag that is output from the ADC 120 and from the window comparator 130, select filter functionality. Therefore, herein, the flag is more specifically also referred to as selection flag.

The processor 150 is coupled to the ADC's output 129, and to the window comparator's output 139. In an embodiment as shown in FIG. 1, where the filter operator 140 is present, the coupling can be implemented in the filter operator 140. The processor 150 is configured to process signals received at the processor input node 151. The processor can be configured to provide a control signal to the voltage generator 110, for example, to control generation of the voltage provided at the output node 119 of the generator 110.

In accordance with an aspect of this disclosure, the processor 150 is configured to test the ADC 120. To this end, the processor can, for example, store a predetermined function of time for use in generation of a voltage variation such as a voltage ramp. For example, the predetermined function is a linear ramp of the voltage (also referred to as voltage swing) from a predetermined test range minimum voltage to a maximum voltage of the predetermined test range. In other words, during the linear ramp, the voltage steadily rises. Other test functions can also be used such as a linear ramp from a maximum voltage of the predetermined test range to a minimum voltage. The skilled person may also contemplate to use a function of time where the voltage does not monotonically change during the test as long as the voltage provided at the output 119 of the voltage generator 110 is known or can be reconstructed by the processor 150 during the test of the ADC. According to some embodiments of the function, the voltage is to be swept from a level below the dynamic input range of the ADC 120 to a level above the dynamic input range, or vice versa.

The processor 150 (or some other processing device coupled to the apparatus 100 and configured to process ADC output) is configured to observe digital codes at predetermined points in time during the voltage ramp. These points in time, for example in an implementation where the voltage generator function is linear, can be evenly spaced apart by a same interval, but other implementations could be contemplated as well where the generated voltage at the point in time can be known as a function of time. For example, given a time of starting a test ramp, periodically talking samples amounts to taking the samples at predetermined points in time. As the generated voltage is swept through the predetermined test range, counts are made of the digital code that is observed at the predetermined points in time.

FIG. 3A is a diagram illustrating output from an ADC according to some embodiments, such as the ADC 120 that is, for instance, configured to generate digital code having N=3 bits. As the input voltage Vin swings from the minimum voltage to the maximum voltage of the predetermined test range, at sample points in time various digital code is observed to be output from the ADC 120. In the illustrated example, the digital code represents 2^N=8 values from 0 to 7.

Figure 3B:
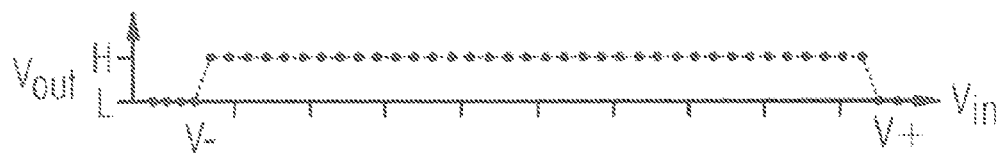
FIG. 3B is a diagram illustrating output from an exemplary window comparator in the apparatus of FIG. 1 according to some embodiments.

FIG. 3B is a diagram illustrating output at sample points in time from an exemplary window comparator according to some embodiments, such as the window comparator 130. As the input voltage Vin swings from the minimum voltage to the maximum voltage of the predetermined test range, a LOW level signal is output from the window comparator as long as the input voltage Vin is below the first threshold V−, a HIGH level signal is output if the input voltage is inside the "window" of the window comparator 130, i.e., if the input voltage exceeds the first threshold V− but does not exceed the second threshold V+, and a LOW signal is output if the input voltage Vin exceeds the second threshold V+.

FIG. 4 is a diagram illustrating a histogram provided in testing the ADC 120 in the apparatus of FIG. 1 according to some embodiments. The histogram shown as an example in FIG. 4 has eight bins. Each bin is associated one-to-one with a digital code that the ADC 120 is configured to generate to represent a level of an input voltage Vin sample. Accordingly, in the case of the illustrated example, the bins comprise counts of samples of 2^3 digital codes 0 to 7 (that is, binary 000 to 111) observed at various points in time during the sweep of the input voltage Vin to the ADC 120 and to the window comparator 130 within the voltage window of the window comparator 130. For example, once the input voltage Vin exceeds the first threshold V−, two samples of a digital code 000 are observed that represents a value 0, four samples of a digital code 001 are observed that represents a value 1, and so forth.

Figure 5:
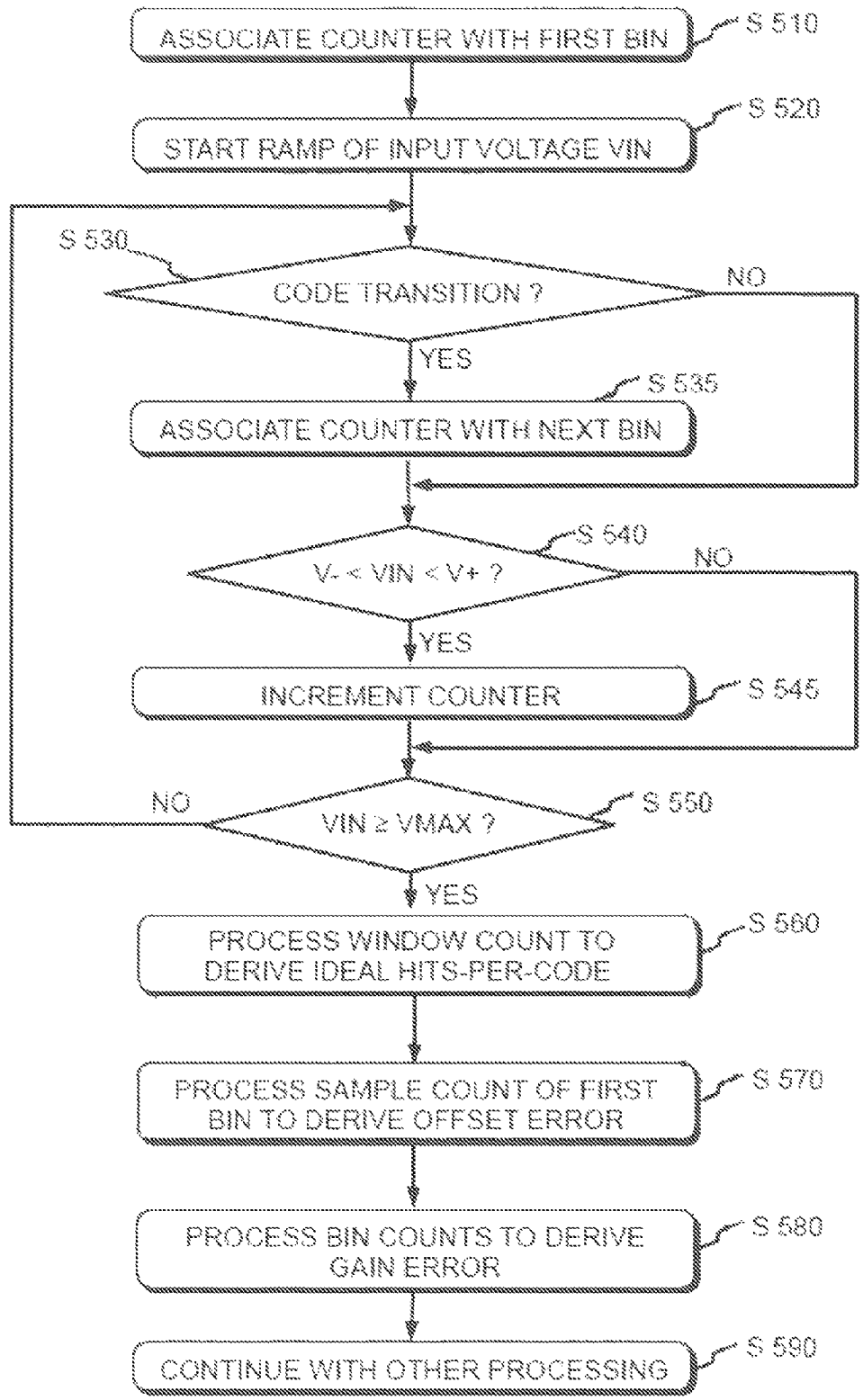
FIG. 5 is a flow chart illustrating a method of testing an ADC according to some embodiments.

FIG. 5 is a flow chart illustrating a method of testing an ADC according to some embodiments. Operation of the apparatus will now be described with reference to FIG. 5.

At S 510, the processor 150 associates a counter with a first bin as a present bin of a histogram that comprises a set of 2^N bins, wherein N is the number of bits of the digital code to be generated in the test method.

At S 520, the voltage generator 110 begins a ramp of the input voltage Vin.

At S 530, the processor 150 determines if, at the output node 129 of the ADC 120 a transition from one digital code to another occurred. If a transition occurred, then, at S 535, the counter is associated with a next bin; otherwise, the association of the counter with the present bin is not changed.

At S 540, it is determined if, at the window comparator's input node 131, the input voltage Vin is inside the voltage window provided by the window comparator 130 or not. If the input voltage is larger than the window comparator's first threshold voltage V− and smaller than the window comparator's second threshold voltage V+, then, at S 545, the present sample of the input voltage Vin as represented by the digital code that the ADC 120 provides at the ADC's output node 129 is selected for counting in the present bin, whereby the digital code of the present sample is selectively associated with the present bin. Accordingly, the counter increments the sample count associated with the present bin by 1. In some implementations the taking of a sample of the input voltage Vin, at S 545, is performed consecutively only at points in time that are evenly spaced apart from one another wherein the interval between the points in time can be predetermined, in some embodiments under control of the processor 150.

At S550, the processor 150 determines if the voltage ramp is completed. The voltage ramp is completed if the input voltage Vin has reached a maximum voltage of the voltage generator's voltage swing, and by that time, associated with each of the bins, a number of samples that were observed as represented by the sample count associated with the respective bin, and incremented as described above with reference to S 545. If the voltage swing is completed, then, at S560, the processor 150 begins processing of the counter data, i.e., of the sample count observed for each bin. Otherwise, while the input voltage Vin is still ramping, the method continues at S 530, as described above.

At S 560, the processor 150 determines a count of all samples [M] taken while the input voltage Vi was within the voltage window of window comparator 130, i.e., while V−<Vin<V+. Based on the count of samples [M] taken while the output 139 of the window comparator 130 was HIGH, i.e., while the input voltage was within the valid range for the ADC 120, and based on N bits of the digital code, the processor 150 can calculate the ideal number Hi of hits per code:

$$Hi = \frac{M}{2^N}$$

The ideal number of hits per code [Hi] of an ideal ADC with N bits can be calculated by counting the number M of samples when the comparator's Vout is high (e.g. signaling that the voltage at the input is within the valid range). In the example illustrated in FIG. 3B, altogether M=36 samples were taken while the input voltage Vin was inside the window of the window comparator 130, i.e., while V−<Vin<V+. Accordingly, assuming an ideally linear ADC, an ideal number of hits per code Hi=M/2^N, that is in the illustrated example Hi=4.5.

At S 570, the processor 150 processes the sample count of the first bin to derive the offset error of the ADC 120 (also referred to as first code transition error). The ideal first code transition occurs after a voltage ramp covered by one digital code, herein also referred to as LSB since one digital code is the least significant bit (LSB). As the exemplary implementation of the ADC 120 has a transfer curve that is compensated by one half LSB. Therefore, the first ideal code transition voltage y[0] occurs already after one half LSB:

$$y[0] = \frac{k}{Hi} - \frac{1}{2} \; [LSB]$$

In the example, the actual first code transition occurs after two samples were taken within the window comparators voltage window. Thus, the first code error y[0] of the (half LSB compensated) ADC 120 is (2/4.5−1/2) LSB=(8/18−9/18) LSB=−1/18 LSB.

At S 580, the processor 150 processes the sample counts of each bin in order to determine the gain error of the ADC 120. If the offset error is subtracted, the gain error is also referred to as the ADC's Full Scale Error. Based on the number of samples [M] selected to be taken within the voltage window, the processor 150 calculates an average number of hits per code. Using only those bins that are not associated with digital codes for input voltages Vin outside the window comparator 130, i.e., ignoring—in the illustrated example—the bins associated with binary 000 and binary 111 (decimal values 0 and 7), an actual average number of hits per code, herein more briefly referred to as mean number of hits per code [Hm], can be calculated. In the example explained with reference to FIG. 3A, FIG. 3B and FIG. 4 the mean number of hits per code is Hm=32/7=4.57. Still at S 580, the processor 150 can calculate the gain error. If the average number of hits per code [Hm] differs from the ideal number of hits per code [Hi], this will result in a non-zero gain error Gerr:

$$Gerr = 2^N * \left(1 - \frac{Hi}{Hm}\right) [LSB]$$

Thus, in the illustrated example, the gain error is calculated to be Gerr=2^3*(1−4.5/4.57)=0.1225.

At S 590, the processor can continue to process the data, for example, to determine a Total Unadjusted Error (TUE). Assuming the transfer function of the ADC 120 to be monotone, and using a sample of the first code transition together with the histogram data, it is possible to calculate other transition points Y[i]=H[i]+Y[i−1]

In the example, eight codes are separated by seven code transitions, i.e., for i=1, . . . , 7 the values are Y[1]=2, Y[2]=6.5, Y[3]=11, Y[4]=15.5, Y[4]=20, Y[5]=24.5, Y[6]=29, and Y[7]=33.5. The person skilled in the art can contemplate calculations of other characteristics of the ADC 120 to be performed by processor 150.

An advantage of the apparatus 100 is that only a minor modification or (re-) configuration of a standard processor, that is, a configuration of a delta-sigma ADC as a window comparator, may be required in order to implement the SAR ADC test capability disclosed herein.

The ADC testing solution disclosed herein is also advantageous as compared with conventional methods. Advantages include fewer requirements on resources in that the window comparator's functionality can be provided by a delta-sigma ADC. Since many integrated circuits comprise a delta-sigma ADC, extra circuitry to implement the window comparator can be kept to a minimum or even completely be avoided by reusing the delta sigma ADC.

Figure 6:
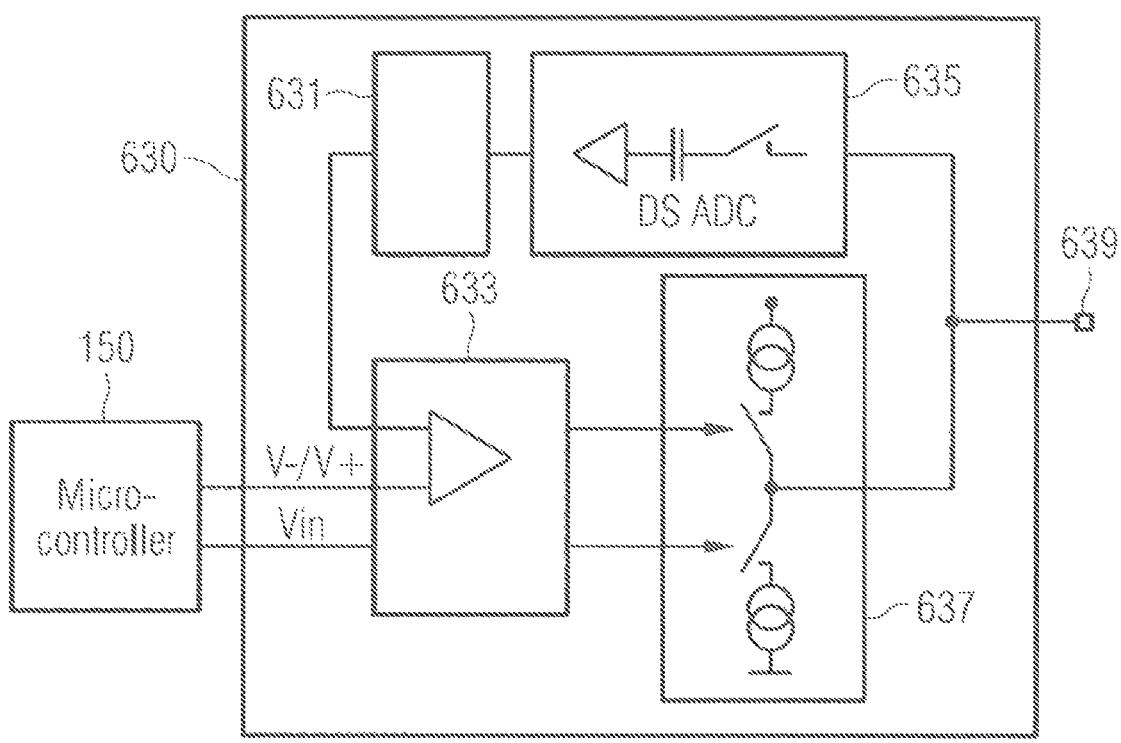
FIG. 6 is a diagram illustrating a window comparator for use in the apparatus of FIG. 1 according to some embodiments.

FIG. 6 is a diagram illustrating a reference voltage unit 630 for use with the window comparator of the apparatus of FIG. 1 according to some embodiments. The reference voltage unit 630 comprises a comparator unit 633, a push-pull circuit 637, and a delta-sigma ADC 635 that is implemented with a filter 631.

In some implementations, the push-pull circuit 637 need not be exclusively dedicated to be used in the window comparator, but can be re-used, i.e., "borrowed" from other functional blocks of a larger application circuit. In some embodiments the push-pull circuit 637 forms part of a built-in self-test (BIST) module of an integrated circuit chip. The push-pull circuit is implemented for BIST functions and reused as well. In some embodiments, the push/pull circuit 637 is implemented with current sources. Another embodiment can be a charge pump (capacitive) or two charge pumps instead the current sources.

The push-pull circuit 637 and the delta-sigma ADC 635 can be configured to operate as a digital-to-analog converter (DAC). The sigma-delta ADC can be also another type of ADC (SAR, flash, etc.).

In some embodiments, the sigma-delta ADC 635 is configured in a feedback loop. In operation, the digital representation of an analog voltage output from the sigma-delta ADC 635 and having passed the filter 631, can be compared in the comparator unit 633 with a digital value provided by the processor 150. Digital control logic comprised in the comparator unit 633 is configured to push or pull the output to supply or ground until the digital result of the sigma-delta ADC is identical to the digital value provided from the processor 150. Thus, the system forms a voltage regulation loop.

The reference voltage unit 630 is configured to co-operate with the microcontroller 150. In particular, the comparator unit 633 is coupled to the processor 150 and configured receive control signals from processor 150. As an alternative or complement to use of the processor 150, control logic (not shown) can be implemented to provide BIST functions. In some implementations, the control logic is configured to perform a built-in self-test at start-up or otherwise before resuming control operation.

The reference voltage unit 630 is configured to exploit the DAC configuration. A voltage at the output node 639 can be driven according to control by the processor 150. Thus, the circuit can set the output node to the first threshold voltage V− and, after the input voltage has passed the first threshold voltage during the ramp of the input voltage, the circuit can set the output node 639 to the second threshold voltage V+.

Although some aspects have been described in the context of an apparatus, these aspects also represent a description of the corresponding method, where a block or device corresponds to a method step or a feature of a method step. Analogously, aspects described in the context of a method step also represent a description of a corresponding block or item or feature of a corresponding apparatus. The disclosed arrangements may be implemented partially or fully in hardware using logic circuits or VLSI design.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

As used herein, the terms 'coupled' and 'connected' may have been used to describe how various elements interface. Unless expressly stated or at least implied otherwise, such described interfacing of various elements may be either direct or indirect.

As used herein, terms such as 'first', 'second', and the like, are also used to describe various elements, regions, sections, etc. and are also not intended to be limiting.

In the above description of exemplary implementations, for purposes of explanation, specific numbers, materials configurations, and other details are set forth in order to better explain the invention, as claimed. However, it will be apparent to one skilled in the art that the claimed invention may be practiced using different details than the exemplary ones described herein. In some instances, well-known features are omitted or simplified to clarify the description of the exemplary implementations.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. It is to be understood that the features of the various embodiments described herein may be combined with each other, unless specifically noted otherwise. This disclosure is intended to cover any adaptations or variations of the specific embodiments discussed herein.

The invention claimed is:

1. A method of testing an analog-to-digital converter, comprising:
providing a set of bins, wherein each bin of the set of bins includes a count of samples for an associated digital representation of an input voltage;
varying the input voltage;
taking samples of the varying input voltage at a plurality of points in time;
based on a selection flag, including each sample in the count of samples for the bin of the set of bins that is associated with the digital representation of the input voltage; and
deriving a converter offset based on a number of samples included in the count of samples for a first bin of the set of bins that is associated with the digital representation of a lowest value of the input voltage.

2. The method of claim 1, further comprising:
determining if the input voltage exceeds a first threshold level; and
setting the selection flag to include the sample in the count of samples for the bin of the set of bins that is associated with the digital representation of the input voltage if the input voltage exceeds the first threshold level when the sample was taken.

3. The method of claim 2, further comprising:
determining if the input voltage is below a second threshold level that is greater than the first threshold level; and
setting the selection flag to include the sample in the count of samples for the bin of the set of bins that is associated with the digital representation of the input voltage if the input voltage is below the second threshold level when the sample was taken.

4. The method of claim 1, wherein the taking samples of the input voltage is performed consecutively at points in time that are evenly spaced apart from one another.

5. The method of claim 1, wherein the varying of the input voltage is performed according to a predetermined voltage variation function of time.

6. The method of claim 5, further comprising:
providing a sum of all samples that are included in the count of samples for at least one bin of the set of bins; and
based on the sum, deriving an average number of samples per bin.

7. The method of claim 5, further comprising:
providing a sum of all samples that are included in the count of samples for all bins of the set of bins; and
based on the voltage variation function of time and the sum, deriving an ideal number of samples per bin.

8. The method of claim 1, wherein the varying of the input voltage is a ramping of the input voltage.

9. The method of claim 8, wherein the ramping of the input voltage changes the input voltage linearly with time.

10. The method of claim 1, further comprising including samples in the count of samples once the input voltage reaches the first threshold level.

11. The method of claim 10, further comprising not including samples in the count of samples once the input voltage has reached the second threshold level.

12. An apparatus for digitally representing an analog value, comprising:
an analog-to-digital converter configured to convert a voltage at an input node to a digital representation of the voltage at an output node; and
a sample select unit configured to determine if the voltage at the input node exceeds a first threshold level and does not exceed a second threshold level, wherein the apparatus is configured to take samples while varying the voltage at the input node and to include each sample in a count of samples for a bin of a set of bins that is associated with a digital representation of the voltage if the voltage at the input node exceeds the first threshold level and does not exceed the second threshold level,
wherein the apparatus is configured to derive, based on the count of samples for the bin of the set of bins that is associated with the digital representation of a lowest voltage at the input node, an offset of the analog-to-digital converter.

13. The apparatus of claim 12, wherein the apparatus is configured to derive, based on the count of samples for each bin of the set of bins that is associated with the digital representation of the voltage at the input node, and as a difference to an average number of samples, a gain error of the analog-to-digital converter.

14. The apparatus of claim 12, wherein the input node is configured to be coupled to a voltage generator that is configured to vary the voltage according to a voltage variation function of time.

15. The apparatus of claim 14, wherein the voltage variation function of time comprises a predetermined linear ramp in time.

16. The apparatus of claim 12, wherein the sample select unit comprises a comparator configured to compare the voltage at the input node to the first threshold level and to the second threshold level.

17. The apparatus of claim 12, wherein the sample select unit comprises another analog-to-digital converter configured to compare the voltage at the input node to the first threshold level and to the second threshold level.

18. The apparatus of claim 17, wherein the another analog-to-digital converter comprises a delta-sigma ADC.

19. The apparatus of claim 12, further comprising a built-in self-test module.

20. The apparatus of claim 12, wherein the apparatus includes a voltage generator.

* * * * *